United States Patent [19]

Socolowski

[11] Patent Number: 4,709,849
[45] Date of Patent: Dec. 1, 1987

[54] SOLDER PREFORM AND METHODS EMPLOYING THE SAME

[75] Inventor: Norbert J. Socolowski, Denville, N.J.
[73] Assignee: Fry Metals, Inc., Providence, R.I.
[21] Appl. No.: 802,240
[22] Filed: Nov. 27, 1985
[51] Int. Cl.$^4$ ............................................. B23K 35/12
[52] U.S. Cl. .................................... 228/246; 228/56.3
[58] Field of Search .................... 228/56.3, 246, 249, 228/250

[56] References Cited

U.S. PATENT DOCUMENTS

| | | | |
|---|---|---|---|
| 2,445,858 | 7/1948 | Mitchell et al. | 228/56.3 |
| 3,340,602 | 9/1967 | Hontz | 29/588 |
| 3,555,669 | 1/1971 | Tarn | 29/589 |
| 3,786,566 | 1/1974 | Weston | 29/473.1 |
| 4,020,987 | 5/1977 | Hascoe | 228/56 |

FOREIGN PATENT DOCUMENTS

| | | | |
|---|---|---|---|
| 175123 | 6/1953 | Fed. Rep. of Germany | 228/56.3 |
| 2032939 | 7/1970 | Fed. Rep. of Germany | 228/56.3 |
| 3226554 | 1/1984 | Fed. Rep. of Germany | |
| 433194 | 8/1935 | United Kingdom | 228/56.3 |

OTHER PUBLICATIONS

A Guide to Preform Soldering, 2/9/60, p. 2.
Taraseiskey, H., "Custom Power Hybrids," *Solid State Technology*, Oct. 1985, pp. 111–117.

*Primary Examiner*—M. Jordan
*Assistant Examiner*—Karen Skillman
*Attorney, Agent, or Firm*—Shapiro and Shapiro

[57] ABSTRACT

A solder preform comprises a body of solder material having at least three legs extending outwardly from a generally central base portion. In a method of use, the preform is disposed between two solderable surfaces (such as the metalized undersurface of a semiconductor die and a support surface therefor), heated above the solder melting point to cause the solder to flow between the surfaces, and then cooled to solidify the solder and effect the bond. The preform configuration is such that the melting solder flows generally outward from the central base portion to expel gases from between the surfaces to be bonded.

1 Claim, 3 Drawing Figures

SOLDER PREFORM AND METHODS EMPLOYING THE SAME

BACKGROUND OF THE INVENTION

This invention relates to methods and apparatus for joining metallic surfaces and is particularly concerned with a solder preform and methods employing the same for providing a solder joint between two solderable surfaces.

The invention is particularly useful, for example, in the manufacture of electronic devices employing high power dissipation semiconductor components, such as power dissipation semiconductor components, such as power transistors and the like. In the assembly of such devices, a semiconductor chip with a metalized undersurface, generally referred to as a die, is soldered to a metal surface of a support structure generally referred to as a header. The header structure functions as a heat sink through which heat is transmitted away from the die to prevent thermal overload of the semiconductor component. Typically, an electrical connection is made to the die via the solder joint with the header. For example, in the case of a power transistor, a connection to the collector will often be made through the header, while connections to the base and emitter are made through wires bonded to metalized portions of a top surface of the chip.

In order for such devices to operate continuously at high power levels, the solder joint between the die and the header must exhibit good thermal and electrical conductivity uniformly along the interface between the die and header. In addition, for the device to be practical, the solder joint must be strong enough to withstand structural stresses which might be experienced during use. To achieve the foregoing characteristics, the solder joint must be kept to a minimum thickness and must be substantially free of voids between the bonded surfaces of the die and header.

Perhaps the most basic technique for soldering a die in place involves the use of a solder body or preform of closed geometric shape (e.g., rectangular or circular solid) which is placed upon a support surface of the header, with the die being placed upon the preform. These components are then passed through a controlled atmosphere furnace at a temperature above the solder melting point but below the melting point of the surfaces to be bonded. The furnace atmosphere is usually hydrogen or a hydrogen-nitrogen mix (known as forming gas) which inhibits oxidation of the surfaces to be bonded and of the preform. On passing through the furnace, the solder preform melts and wets the metalized surface of the die and the header support surface. The assembly is then cooled so the solder solidifies to effect a bond.

In practice of the foregoing technique, the formation of voids in the solder joint can be particularly problematic. Void formation is generally the result of gases which are entrapped between the solder preform and the opposing surfaces of the die and header during formation of the solder joint—that is, when the solder is melted. If the voids are not dispersed over the bonded surfaces of the die and header or cover an excessive area (e.g., 10% or more) of the bonded die surface, or if a single void is too large (typically, in excess of 5% of the bonded surface area of the die), thermal failure of the semiconductor component can result.

Another problem with the previously described soldering technique arises from the extreme thinness of the preform. Because the preform must be made very thin to control the amount of solder in the bond, uneven melting of the preform can remove support from certain areas under the die and cause shifting of the die on the header due to surface tension of the melting solder. This shifting can make subsequent bonding of wires to the die difficult due to poor alignment of the die and is therefore highly undesirable. Also, the thinness of the preform can cause difficulties in handling.

One technique which has been proposed for providing a better solder joint in the manufacture of semiconductor devices is disclosed in U.S. Pat. No. 3,786,556 issued Jan. 22, 1974 to Weston. Weston's technique involves the placement of preferably two preforms laterally adjacent the die on the support surface of the header. Upon passage of the header with the preform and die thereon through a furnace, the preform melts and solder flows between the opposed die and header surfaces by capillary action to fill the area between the surfaces. The flow of solder toward and between the surfaces may assist in the expulsion of gases from between the surfaces. As a modification to the foregoing technique, Weston also proposed the placement of two solder preforms at spaced locations on the support surface of the header and placement of the die on the preforms, with peripheral portions of the preforms supporting peripheral portions of the die. The flow of solder laterally into the space between the preforms is said to expel gases from between the surfaces to be bonded.

While techniques involving two spaced preforms may offer the advantage of reduced void formation, there are significant practical disadvantages to such techniques. First, the use of two preforms requires a significant amount of assembly time in preparation for heating. In particular, the preforms must be very accurately positioned on the header support surface prior to the placement of the semiconductor die. This is a very time consuming and thus costly operation. In addition, when such preforms are disposed on the header largely or entirely laterally adjacent the die, as discussed above, it can be difficult to control precisely the amount of solder which ultimately forms the bond since solder is permitted to flow and remain well beyond the die perimeter. Furthermore, laterally disposed preforms can also cause problems with the die shifting. The latter two of the aforementioned disadvantages are, of course, a concern even with only a single laterally disposed preform. Finally, as has heretofore been true with respect to preforms generally, the preforms of such proposed improvements are characteristically quite thin and difficult to handle.

SUMMARY OF THE INVENTION

In accordance with the present invention, it has been discovered that a solder joint having high thermal and electrical conductivity as well as excellent mechanical strength may be obtained through the use of a single solder preform of novel configuration placed between the two surfaces to be bonded. The preform configuration of the invention causes gases to be expelled from between the surfaces to be bonded as the solder material flows, thereby minimizing void formation. Also, because bonding is effected with only a single preform, the time consuming positioning requirements of multiple preform techniques are avoided. Furthermore, as will be explained hereinafter, solder preforms according to the invention substantially reduce die shifting and may be of increased thickness in comparison to prior preforms, so as to be easy to handle.

More particularly stated, in one of its broad aspects, the invention pertains to a solder preform comprising a body of solder material having at least three legs extending outwardly from a generally central base portion. In a preferred embodiment, the preform is substantially flat with elongate legs extending radially from the base portion and having free ends opposite the base portion. In a particularly peferred form, the preform has four radially projecting legs disposed at 90° angles about the base portion.

In another of its broad aspects, the invention pertains to a method of bonding solderable surfaces, comprising providing a solder preform configured as just discussed, disposing the preform between the solderable surfaces to be joined, with the surfaces being in contact with the preform, subjecting the preform to a temperature above the melting point of the solder material to cause the material to flow between the surfaces to be joined, and cooling the flowed solder material to solidify the same and thereby bond the aforementioned surfaces together.

In a preferred method according to the invention, the surfaces to be bonded are solderable surfaces of a semiconductor chip (i.e., a die) and a supporting structure (such as a header). The surface of the supporting structure is oriented substantially in a horizontal plane and the preform is then placed with its legs flat on that surface. The solderable surface of the die is then placed on the preform, resting flat against the legs of the preform. The foregoing assembly is then heated and cooled to effect the bond.

BRIEF DESCRIPTION OF THE DRAWING

The various features and advantages of the invention will be better understood from the ensuing description of the preferred embodiments, taken in conjunction with the accompanying drawings wherein.

DETAILED DESCRIPTION OF THE PREFERRED EMBODIMENTS

The invention will now be explained in connection with the bonding of a semiconductor die to a header in a power transistor. The power transistor structure to be described is of a conventional design, the invention being applicable in particular to the assembly of the transistor. As will be apparent to those skilled in the art, the illustrative transistor device is merely exemplary of the broad range of applicability of the invention in the production of electronic devices and, more generally, in the bonding of any solderable surfaces. It is to be understood that references to solder, soldering and the like as used herein are intended in a broad sense as pertaining to the bonding of metallic surfaces by a filler metal. Thus, such references are intended to embrace both low temperature soldering, usually referred to more specifically as soft soldering, and high temperature soldering, usually referred to as brazing.

Figure 1:
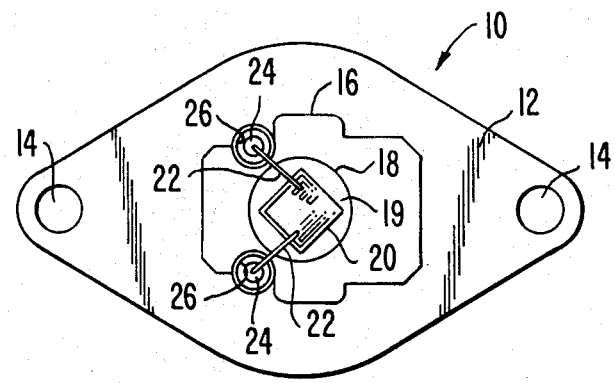
FIG. 1 is a plan view of a semiconductor die and header assembly of a power transistor.

FIG. 1 is a plan view of a conventional power transistor 10. The casing of the transistor has been omitted from the drawing in order to illustrate the internal components of the transistor. The transistor header, which is of a standard configuration designated in the trade as TO-3, includes a base plate 12 of steel, for example, having a pair of mounting apertures 14 through which screws or other appropriate mounting means may be passed. A metal heat sink 16, which may be nickel-electroplated copper, is bonded in a conventional manner to the top surface of base plate 12. A heat spreader 18 in the form of a disk is bonded to the top surface of heat sink 16, also by conventional means. The disk, like heat sink 16, may be copper with a coating of nickel electroplate.

In addition to the header structure just described, as will be seen in FIG. 1, transistor 10 includes a semiconductor die 20 which is bonded to a support surface of the header. More specifically, die 20 is bonded to the top surface 19 of heat spreader 18. In the form shown, die 20 is rectangular; however, the invention is equally applicable to other die shapes (e.g., circular dies), as will become apparent hereinafter. The manner in which the die and heat spreader may be bonded in accordance with the invention will be described in detail later. Die 20 is assumed to include the usual semiconductor wafer portion, which embodies the transistor element of device 10, with a metalized coating bonded to its undersurface. The coating may, for example, be composed of molybdenum-manganese alloy with an overlying nickel plating to promote solderability. It is further assumed that, as is typical, the collector region of the transistor element is electrically connected to the header via the metalized die undersurface and the solder joint with the heat spreader 18. Connections to the base and emitter regions of the transistor element are by way of wires 22 which are bonded, as by ultrasonic bonding, to corresponding metalized connection points on the top surface of the die and which are connected to corresponding connection posts 24 sealingly secured in the usual manner in respective apertures 26 of the base plate 12.

A practical embodiment of a power transistor in accordance with the preceding description could incorporate with following parameters:

Heat Sink
   0.63 in. (16 mm) length
   0.5 in. (12.7 mm) width
   0.005 in. (1.3 mm) thickness
   0.0001 in. (0.0025 mm) plating thickness Heat Spreader
   0.438 in. (11.1 mm) diameter
   0.02 in. (0.51 mm) thickness
   0.0001 in. (0.0025 mm) plating thickness Die
   0.204 in.×0.186 in. (5.2 mm×4.7 mm)

It will be understood that the materials of construction and dimensional parameters for the components of transistor 10 as described hereinabove are merely exemplary and will, in practice, vary depending upon the design criteria of a particular application. Naturally, construction materials and design details will also vary with the type of component being assembled. In many cases, for example, a die will be supported directly on a heat sink, with no intervening heat spreader being used. In the illustrative embodiment, the heat spreader/heat sink arrangement facilitates the mounting of additional components into the device, such as an RC time delay network or fusing means for the transistor.

Typical materials of construction of the die supporting member (i.e., heat spreader or heat sink) in practice will include aluminum, copper, metalized alumina, or beryllia, with a coating of nickel or gold for solderability. Semiconductor dies will typically be constructed of such materials as silicon or germanium, with a metalized bond undersurface coating of molybdenum/manganese alloy or similar conducting material which is plated with nickel or gold for solderability. For additional background regarding materials of construction and other design considerations, the reader may wish to refer to the recent article: Taraseiskey, H., "Custom Power Hybrids," *Solid State Technology*, October 1985, pp. 111-117.

Figure 2:
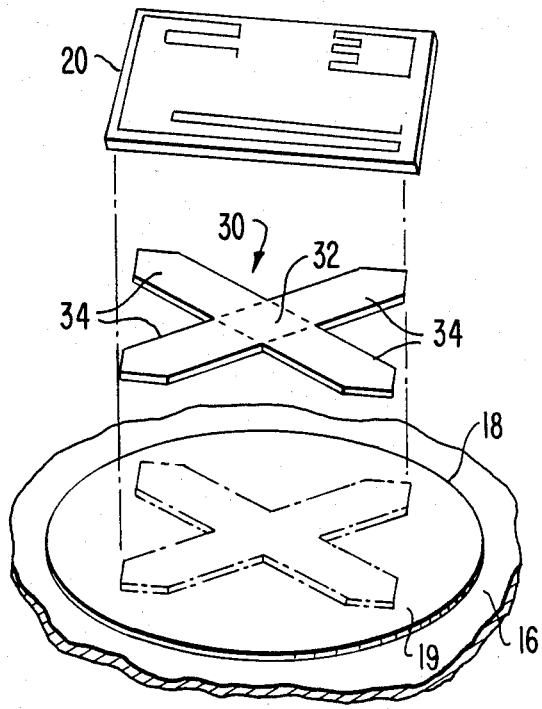
FIG. 2 is a perspective view showing a solder preform in accordance with the invention and depicting the manner of arranging the preform with the die and header of FIG. 1 preparatory to bonding the die to the header.

FIG. 2 depicts a solder preform 30 in accordance with the invention and the manner in which the preform is arranged with respect to the heat spreader 18 and die 20 in preparation for soldering. The illustrative preform 30 comprises a body composed of a suitable solder material for bonding the heat spreader 18 and die 20 (e.g., 63% tin, 37% lead), the body having four legs 34 of equal length extending outwardly from a central base portion 32 which is demarcated by dashed lines in FIG. 2. Preform 30 is preferably substantially flat, as shown, so that it may be disposed between and in flat contact with surface 19 of the heat spreader and the undersurface of die 20. Preform 30 may thus be a body of solder foil, for example, formed by punching of the foil through a correspondingly shaped die. Solder compositions will, of course, vary with design requirements, but will typically be an alloy composed of at least two of lead, tin, silver, gold, and indium. Exemplary solder alloy compositions are given in the previously identified article by Taraseiskey.

In the illustrative embodiment, the legs 34 of solder body 30 are elongate and extend radially outward from the base portion 32. The legs have respective free ends of isosceles right-triangular cross section opposite the base portion, as shown. The triangular cross section of the free ends of legs 34 simplifies the production of a die for punching the preform and tends to ensure that the punched preform is flat. Other shapes may also be used for the free ends of the legs, but may not facilitate production and handling. Squared ends, for example, while perfectly applicable within the principles of the invention, may tend to bend back at the corners during punching and require a more costly die.

In preparation for soldering of die 20 to heat spreader 18, the header structure of transistor 10 is oriented so that the top surface 19 of the heat spreader lies in a substantially horizontal plane. Preform 30 is then placed flat upon surface 19, as shown in phantom in FIG. 2. Thereafter, die 20 is placed upon preform 30, as indicated by vertical dot-dash lines in FIG. 2, with the metalized under-surface of the die lying flat upon the preform.

Figure 3:
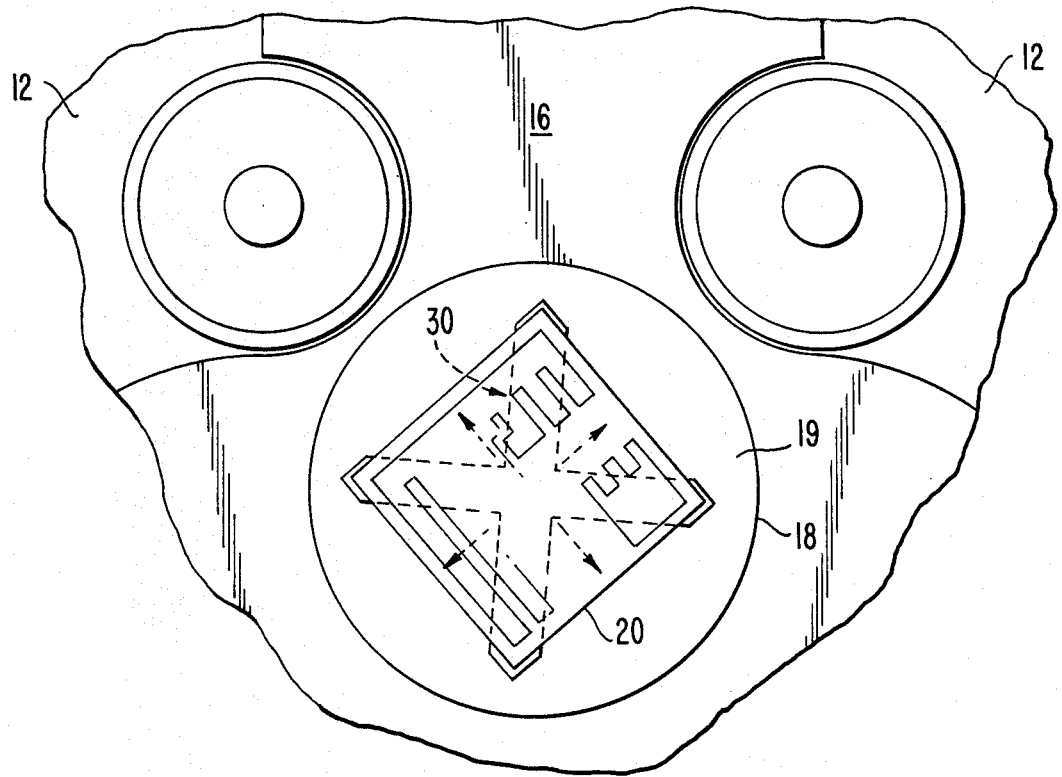
FIG. 3 is an enlarged plan view showing the arrangement of the preform, die, and header prior to bonding.

FIG. 3 is a plan view of the assembled components, as just described. As will be observed in FIG. 3, die 20 has been placed concentrically upon preform 30, with the legs of the preform lying centered under the diagonals of the die. In practice, the die may be placed upon the peform with the legs of the preform oriented in any manner as may be convenient in a particular application, the illustrative orientation being but one example. For instance, it may be more convenient or otherwise desirable from a production standpoint in some cases that the preform be situated with its legs parallel to the peripheral edges of the die or that the base portion of the preform not be precisely centered beneath the die.

In the example given, legs 34 of the preform 30 are of a length sufficient for the triangular free ends to protrude just slightly beyond the corners of die 20, as shown. By using a preform so dimensioned, it is possible to detect misalignment between the die, preform and header from a desired arrangement. Also, in mass production, the protruding portions of the preform would serve to indicate when the supply of preforms has been exhausted. More particularly, if the protruding portions could not be observed on the assembly line, exhaustion of the supply would be indicated.

It will be appreciated that preform 30 contains all of the solder required to be present in the finished joint between surface 19 of the heat spreader and the undersurface of die 20. Since the solder is concentrated into the small area of the legs 34, preform 30 can be made thicker than a conventional solid geometric preform (e.g., a solid rectangular preform) containing the same amount of solder. The increased thickness of preform 30 renders it easily handled and less subject to being damaged. It has been found that preforms in accordance with the invention are easily handled with vacuum probes, for example.

For the 0.204 in.×0.186 in. (5.2 mm×4.7 mm) die mentioned earlier herein, suitable dimensions for preform 30 would be as follows:

Leg length base to tip—0.127 in. (3.2 mm)
Leg width—0.043 in. (1.1 mm)
Base portion dimensions—0.043 in. (1.1 mm) square
Solder thickness—0.0039 in. (0.01 mm)

As will be apparent, a preform with the dimensions just given will have a leg length substantially three times leg width, the leg width being the same as the distance between opposite sides of the base portion perimeter. With respect to the die side length, it will be seen that the leg width is about 21 percent of the longer die side length and about 23 percent of the shorter side length. As can readily be calculated from the above dimensions, with the preform centered beneath the die as shown in FIG. 3, the open area beneath the die (i.e., the area between the preform legs bridged by the die) will be substantially 50 percent of the area of the die undersurface.

In order to effect a bond between the header and die of transistor 10, these components, with the preform disposed between their two solderable surfaces, are passed through a controlled atmosphere furnace in the usual way. In the illustrative example, no flux is required; however, flux may be desirable in some applications. The furnace, having the usual atmosphere of hydrogen or forming gas maintained at a dew point of −40° C. or less, heats the assembled components at a controlled rate to about 20° C. above the solder melting point with the duration above the melting point being about 3 minutes. The assembly is then cooled to ambient temperature at a rate of approximately 100° C. per minute to solidify the solder and effectively bond the opposed surfaces of the die and header.

While the assembly is at a temperature above the melting point of the solder, the preform 30 is caused to melt and to flow by capillary action between the opposed surfaces of the header and die. More particularly, as the preform melts, the material of legs 34 and base portion 32 flows into the open areas between the legs 34 and outwardly toward the perimeter of the die. The solder flow is indicated generally by dashed arrows in FIG. 3. Because the areas between legs 34 are open to the outside, it will be appreciated that the outward flow of solder in this manner pushes any gases in these area out from beneath the die. In addition, gases between the preform and the surface portions of the header and die in contact with the preform can escape into these open areas as the preform starts to melt and thereafter be pushed out from between the header and die with other gases as the solder flows outwardly. Thus the resulting solder joint will be substantially free of voids and therefore offer good electrical and thermal conductivity as well as excellent mechanical strength.

In addition to the above-mentioned advantages, preform 30 offers other very significant advantages in practice. For example, the spaces between legs 34 admit the furnace atmosphere between the solderable surfaces of the die and header prior to melting of the preform, thereby permitting the furnace gas to clean the surfaces before bonding. Preform 30 also offers the advantage of precise control of the amount and thickness of solder which bonds the die and header surfaces. This is possible because the volume of the preform is positioned largely beneath the die and does not flow out onto the support surface of the header (i.e., heat spreader top surface 19) substantially beyond the perimeter of the die. Another advantage of the multi-leg structure of preform 30 is a reduced possibility of die shifting. More particularly, the preform, due to its symmetry and uniform exposure to the furnace atmosphere (all of the legs and base being exposed) tends to melt uniformly. In addition, if one leg should start to melt somewhat prematurely, the remaining legs will continue to support the die and thus inhibit shifting.

As will be appreciated from the preceding example, a solder preform in accordance with the present invention is configured on the basis of certain general considerations including, inter alia, provision of stable support for the die, minimization of contact area between the preform and solderable surfaces to avoid entrapment of gases between the preform and the surfaces, provision of a path for escape of gases from between the surfaces during bonding, and generally outward solder flow to force gases out from between the surfaces.

In any given application, numerous preform configurations may be consistent with the foregoing considerations sufficiently to provide an entirely satisfactory solder joint. For instance, in the exemplary application described hereinabove, a preform having three legs (e.g., projecting radially at 120° angles from a central base portion) could equally have been used; and, while an adequate joint would be obtainable with such a preform, the four legged form is preferred based on the more stable support which would be provided in the event of premature melting of one leg (three remaining supporting legs instead of two). Also, while it is generally preferred that the preform be symmetric with legs projecting radially outward from a base portion at the center in order to minimize the area of the base portion and to provide a uniform outward solder flow, these characteristics are not required. More particularly, it will often be possible to achieve a good solder joint if the base portion lies just generally toward the center of the preform, with the legs projecting outwardly therefrom. A generally outward solder flow will still be obtained in such case, although the quality of the resulting joint may not be optimal. As to the number of legs, more or less than the exemplary four may be desirable depending upon the requirements of a particular application. Generally, as the area of the surfaces to be bonded increases, more legs will be desirable to provide increased support as well as additional solder to cover the further surface area to be bonded. In any event, to obtain the desired outward flow and surface support, a minimum of three legs should be used. Two legs, or a "V" shape for example, may or may not provide adequate support, but will not offer the desired outward flow of solder from a generally central region of the preform. Lastly, in connection with the preform legs, straight leg configurations with free ends opposite the base portion, as in the illustrative embodiment, will generally minimize the possibility of entrapping gases between the surfaces to be joined.

The scope of the invention, which embraces the preferred embodiments described herein and the numerous possible modifications which will be apparent to those skilled in the art, is defined in the appended claims wherein, as noted earlier, the terms solder and solderable are used in their broad context and are intended to encompass both low temperature (soft soldering) applications and high temperature (brazing) applications.

I claim as my invention:

1. A method of soldering a substantially rectangular semiconductor die to a supporting surface, comprising
   providing a solder preform including a body of solder foil having four legs extending outward from a generally central base portion of the body at angles corresponding to angles between the diagonals of the semiconductor die,
   placing the solder preform in a desired position with its legs on the supporting surface,
   placing the semiconductor die on the solder preform, with the die being positioned such that the base portion of the preform lies substantially beneath the center of the die and the legs of the preform lie beneath the diagonals of the die, the legs of the preform being of sufficient length such that with the die positioned on the preform as aforesaid they project slightly outward from respective corners of the die and thereby indicate alignment of the legs with the diagonals of the die positioned thereon,
   heating the preform sufficiently to melt the solder thereof and to cause the solder to flow, solder flow between the die and the supporting surface being generally away from the base portion of the preform toward the periphery of the die, and
   cooling the flowed solder to solidify the same and thereby bond the die to the supporting surface.

* * * * *